United States Patent [19]
Kuramoto et al.

[11] Patent Number: 6,078,062
[45] Date of Patent: Jun. 20, 2000

[54] II-VI COMPOUND SEMICONDUCTOR BASED LIGHT EMITTING DEVICE HAVING RECOMBINATION REGIONS SPATIALLY ARRAYED IN A PLANAR DIRECTION OF THE ACTIVE LAYER TO PREVENT CRACK PROPAGATION

[75] Inventors: Masaru Kuramoto; Kenichi Nishi; Hiroshi Iwata, all of Tokyo, Japan

[73] Assignee: NEC Corporation, Tokyo, Japan

[21] Appl. No.: 08/936,921

[22] Filed: Sep. 25, 1997

[30] Foreign Application Priority Data

Sep. 26, 1996 [JP] Japan .................................. 8-254619

[51] Int. Cl.$^7$ .................................................. H01L 33/00
[52] U.S. Cl. ................................ 257/96; 257/86; 257/87; 257/190; 257/201
[58] Field of Search ................................ 257/96, 98, 87, 257/86, 101, 93, 190, 201; 438/34, 35

[56] References Cited

U.S. PATENT DOCUMENTS

| | | | |
|---|---|---|---|
| 4,148,045 | 4/1979 | Fang et al. | 357/17 |
| 4,396,929 | 8/1983 | Ohki et al. | 357/17 |
| 4,868,614 | 9/1989 | Yamazaki | 357/17 |
| 5,057,880 | 10/1991 | Eshita et al. | 357/16 |
| 5,091,767 | 2/1992 | Bean et al. | 357/60 |
| 5,216,261 | 6/1993 | Inata et al. | 257/15 |
| 5,389,800 | 2/1995 | Itaya et al. | 257/94 |
| 5,477,063 | 12/1995 | Shakuda | 257/94 |
| 5,483,547 | 1/1996 | Adams et al. | 372/45 |
| 5,610,413 | 3/1997 | Fan et al. | 257/97 |
| 5,732,099 | 3/1998 | Kawasumi et al. | 372/48 |
| 5,751,013 | 5/1998 | Kidoguchi et al. | 257/13 |
| 5,751,014 | 5/1998 | Nakatsu et al. | 257/25 |

FOREIGN PATENT DOCUMENTS

| | | |
|---|---|---|
| 6-244113 | 9/1994 | Japan . |
| 06349736 | 12/1994 | Japan . |
| 6-349736 | 12/1994 | Japan . |
| 7-45904 | 2/1995 | Japan . |
| 7-202312 | 8/1995 | Japan . |
| 7-231084 | 8/1995 | Japan . |
| 7-335987 | 12/1995 | Japan . |

OTHER PUBLICATIONS

Kimura et al., "Structural Study of Zn/S/ZnSe Strained Layer Superlattice Grown by Molecular Beam Epitaxy," Electronic Manufacturing Technology Symposium, 1995, Proceedings of 1995 Japan International, 18th IEEE/CPMT International, pp. 183–186.

S. Guha et al., "Degradation of II–VI based blue–green light emitters", *Appl. Phys. Lett.*, vol. 63, No. 23, Dec. 6, 1993, pp. 3107–3109.

S. Guha et al., "<100> dark line defect in II–VI blue–green light emitters", *Appl. Phys. Lett.*, vol. 65, No. 7, Aug. 15, 1994, pp. 801–803.

L.H. Kuo et al., "Effects of interfacial chemistry on the formation of interfacial layers and faulted defects in ZnSe/GaAs", *Appl. Phys. Lett.*, vol. 68, No. 17, Apr. 22, 1996, pp. 2413–2415.

S. Taniguchi et al., "100h II–VI blue–green laser diode", *Electronics Letters*, Mar. 14, 1996, vol. 32, No. 6, pp. 552–553.

*Primary Examiner*—Jerome Jackson, Jr.
*Assistant Examiner*—Bradley W. Baumeister
*Attorney, Agent, or Firm*—Sughrue, Mion, Zinn, Macpeak & seas, PLLC

[57] ABSTRACT

Provided by the present invention is a II–VI compound semiconductor based light emitting device which is suppressed in the propagation velocity of crystal defects at the time of current application, has a prolonged lifetime and can be readily mass produced. The device has a recombination region and non-recombination region of carriers which have been separated spatially each other in the plane of the active layer.

17 Claims, 5 Drawing Sheets

II-VI COMPOUND SEMICONDUCTOR BASED LIGHT EMITTING DEVICE HAVING RECOMBINATION REGIONS SPATIALLY ARRAYED IN A PLANAR DIRECTION OF THE ACTIVE LAYER TO PREVENT CRACK PROPAGATION

BACKGROUND OF THE INVENTION

1. Field of the Invention

This invention relates to a II–VI compound semiconductor based red-green or -blue light emitting device.

2. Description of the Related Art

As described in "Applied Physics Letters, 63, 3107(1993)", the degradation of a wide-gap II–VI compound semiconductor based light emitting device occurs by the stacking faults or through dislocations formed during crystal growth. The letter reveals that rapid formation and propagation of such defects occur in the active layer at relatively high current densities required for lasing, leading to the formation of a dislocation network.

As described in "Applied Physics Letters, 65, 801(1994)", dark line defects in the <100> direction are observed in or in the vicinity of the active layer of the II–VI compound semiconductor based light emitting device which have been degraded by the application of a current, and point defects are presumed to participate in the dark line defects.

Stacking faults generated from the crystal interface between a GaAs substrate and a II–VI compound, which are regarded to be a cause for the degradation, can be suppressed to $1 \times 10^4/cm^2$ or lower by forming a GaAs buffer layer on the GaAs substrate to cover the substrate with As and then exposing the resulting substrate to Zn ["Applied Physics Letters, 68, 2413(1966)"].

Even if the crystal defects appearing from the interface can be reduced, the formation and propagation of defects in the active layer which are formed at the time when a current is applied cannot be avoided. The existing II–VI compound semiconductor based laser is accompanied with the drawbacks such as a short lifetime, as short as about 100 hours, and difficulty in mass production from the viewpoints of reproducibility and reliability [Taniguchi et al., "Electronics Letters, 32, 552(1996)].

SUMMARY OF THE INVENTION

An object of the present invention is to provide a II–VI compound semiconductor based light emitting device which has a prolonged lifetime and can be readily mass-produced by suppressing the formation and propagation velocity of crystal defects at the time when a current is applied.

In a first aspect of the present invention, there is thus provided a II–VI compound semiconductor based light emitting device which has an active layer which has been separated spatially into a recombination region and a non-recombination region of carriers in the planar direction of the active layer.

In a second aspect of the present invention, there is also provided a II–VI compound semiconductor based light emitting device as described in the first aspect of the invention, wherein the active layer is separated spatially into a recombination region and a non-recombination region of carriers corresponding to a step distance of the substrate in the thickness direction of the layer by using a slanted substrate and effecting the step flow growth of the active layer in the plane of the active layer.

In a third aspect of the present invention, there is also provided a II–VI compound semiconductor based light emitting device as described in the first aspect of the present invention, wherein the recombination region is formed of a material having a type I hetero junction and the non-recombination region is formed of a material having a type II hetero junction.

In a fourth aspect of the present invention, there is also provided a II–VI compound semiconductor based light emitting device as described in the first aspect of the present invention, wherein the recombination region is formed of a direct transition semiconductor material and the non-recombination region is formed of an indirect transition semiconductor material.

In a fifth aspect of the present invention, there is also provided a II–VI compound semiconductor based light emitting device as described in the first aspect of the present invention, wherein the active layer is obtained by growing an active layer material having a distortion amount of at least 1.5% to cause self-formation of recombination regions, which are independent of each other, on the surface and then forming a non-recombination region by burying a barrier material between said recombination regions.

In a sixth aspect of the present invention, there is thus provided a II–VI compound semiconductor based light emitting device as described in the first aspect of the present invention, wherein the active layer is obtained by growing a barrier material having a distortion amount of at least 1.5% to cause self-formation of non-recombination regions, which are independent of each other, on the surface and then forming a recombination region by burying an active layer material between the non-recombination regions.

In a seventh aspect of the present invention, there is also provided a process for the fabrication of a II–VI compound semiconductor based light emitting device as described in the first aspect of the invention, which comprises using a slanted substrate, effecting step flow growth of the active layer in the plane of the active layer, and thereby forming the active layer separated spatially into a recombination region and a non-recombination region of carriers corresponding to a step distance of the substrate in the thickness direction of the layer.

In an eighth aspect of the present invention, there is thus provided a process for the fabrication of a II–VI compound semiconductor based light emitting device as described in the first aspect of the present invention, which comprises growing an active layer material having a distortion amount of at least 1.5% to cause self-formation of recombination regions, which are independent of each other, on the surface, and forming a non-recombination region by burying a barrier material between said recombination regions, thereby forming the active layer.

In a ninth aspect of the present invention, there is thus provided a process for the fabrication of a II–VI compound semiconductor based light emitting device as described in the first aspect of the present invention, which comprises growing a barrier material having a distortion amount of at least 1.5% to cause self-formation of non-recombination regions, which are independent of each other, on the surface, and forming a recombination region by burying an active layer material between said non-recombination regions, thereby forming the active layer.

In the II–VI compound semiconductor based device on a substrate, according to the present invention, dark line defects in the <100> direction with result from point defects associated with rapid degradation can be suppressed by separating a recombination region and a non-recombination region spatially in the active layer, because such degradation depends largely on the distortion amount in the active layer and the recombination density of carriers and the propagation of the defects occurs in a certain direction.

The greater the distortion amount of the active layer or the greater the recombination density of carriers, the less the resulting device is resistant to defects. It is therefore possible to suppress the propagation of the defects, which occurs in a certain direction, within a barrier region by separating a recombination region (a region having a distortion and being high in the recombination density of carriers, which region may hereinafter be called "light-emitting region") and a non-recombination region (a region having a little or no distortion and being almost free from the recombination of carriers, which region may hereinafter be called "barrier region").

The present invention therefore makes it possible to provide a II–VI compound semiconductor based light emitting device which is suppressed in the propagation velocity of crystal defects at the time of current application, has a prolonged lifetime and can be readily mass produced.

BRIEF DESCRIPTION OF THE PREFERRED EMBODIMENTS

EXAMPLE 1

Figure 1A:
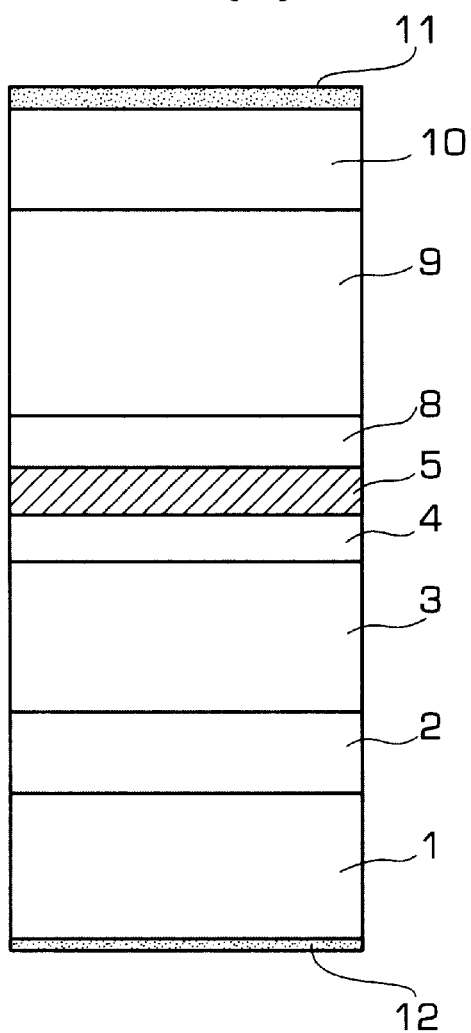
FIGS. 1(A)–(C) are block diagrams of a II–VI compound semiconductor based light emitting device according to a first embodiment of the present invention.

FIG. 1(a) is a cross-sectional view illustrating the structure of a semiconductor laser according to one embodiment of the present invention. On an n-type GaAs substrate 1, an n-type buffer layer 2 formed of silicon-doped GaAs (silicon concentration: $1 \times 10^{18}$, thickness: 300 nm) and chlorine-doped ZnSe (chlorine concentration: $5 \times 10^{17}$, thickness: 30 nm), an n-type cladding layer 3 formed of chlorine-doped $Zn_{0.92}Mg_{0.08}S_{0.12}Se_{0.88}$ (chlorine concentration: $5 \times 10^{17}$, thickness: 1.5 μm) and an n-type guiding layer 4 formed of chlorine-doped $ZnS_{0.06}Se_{0.94}$ (chlorine concentration: $5 \times 10^{17}$, thickness: 120 nm) were grown in the above-described sequence by the MBE method.

Figure 1B:
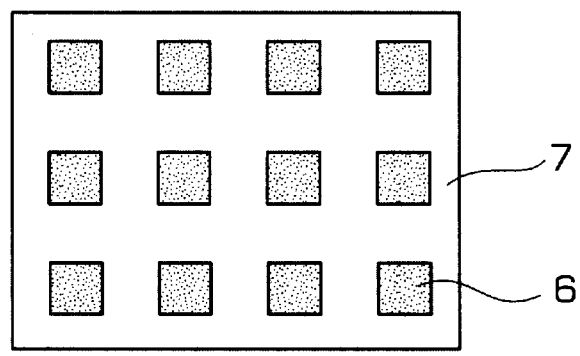
Figure 1C:
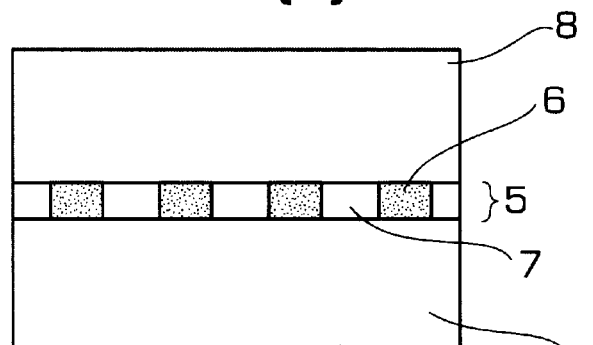

An active layer 5 was then formed as described below. First, a layer formed of ZnCdSe (thickness: 6.5 nm) was formed. On the ZnCdSe layer, a rectangular mask pattern (a 50 nm square) as shown in FIG. 1(b) was formed by the exposure technique and was then subjected to reactive ion etching to leave only ZnCdSe light emitting regions 6 beneath the resist. After the removal of the resist, the resulting substrate was transported again to the MBE growth apparatus, where $ZnS_{0.06}Se_{0.94}$ was buried between the light emitting regions 6 to form a barrier region (non-light-emitting region) 7 [FIGS. 1(b) and (c)]. Incidentally, FIG. 1(b) is a plane view of the active layer 5, while FIG. 1(c) is a cross-sectional block diagram of three layers, that is, n-type guiding layer 4, active layer 5 and p-type guiding layer 8.

On the substrate so obtained, a p-type guiding layer 8 formed of nitrogen-doped $ZnS_{0.06}Se_{0.94}$ (chlorine concentration: $4 \times 10^{17}$, thickness: 120 nm), a p-type cladding layer 9 formed of nitrogen-doped $Zn_{0.92}Mg_{0.08}S_{0.12}Se_{0.88}$ (nitrogen concentration: $1 \times 10^{17}$, thickness: 1 μm) and a p-type contact layer 10 formed of nitrogen-doped ZnSeTe (nitrogen concentration: $1 \times 10^{18}$, thickness: 0.05 μm) were epitaxially grown.

On the wafer so obtained, an Au electrode 11 (thickness: 200 nm) was formed by the vacuum deposition method, while an In electrode 12 was formed on the side of the substrate.

When a direct current was applied to the semiconductor laser of FIG. 1 fabricated in the above-described manner, the laser oscillated at a wavelength of 510 nm and its lifetime was as long as about 1000 hours. From the laser whose oscillation stopped, destruction of the electrode portion was observed, which clearly indicated that the termination of the oscillation did not result from the degradation caused by the propagation of defects. As a result of the observation inside the active layer, defects appeared in some of many ZnCdSe light emitting regions 6 but the propagation of the defects in the region was suppressed. It has therefore been confirmed that the constitution in which light emitting regions were formed independently of each other is effective for suppressing the propagation of the defects.

In this embodiment, ZnCdSe was used as a material active layer material) for the light emitting regions 6 of the active layer 5. It is also possible to use the other II–VI compound semiconductor materials such as ZnSe and ZnCdSSe and those containing Te, Be or Mg having a band gap and reflectance similar to that of ZnCdSe. As a material (barrier material) for the barrier region 7, ZnSSe was used but ZnMgSSe or the like having both a larger band gap and a lower reflectance can also be used. As a material for the cladding layer, ZnMgSSe was employed but it is also possible to use other II–VI compound semiconductor materials such as ZnMgCdSe and BeMgSeTe. As a substrate, an n-type GaAs was used. Alternatively, substrates formed of the other materials such as p-type GaAs substrate and ZnSe substrate can also be used.

EXAMPLE 2

Figure 2A:
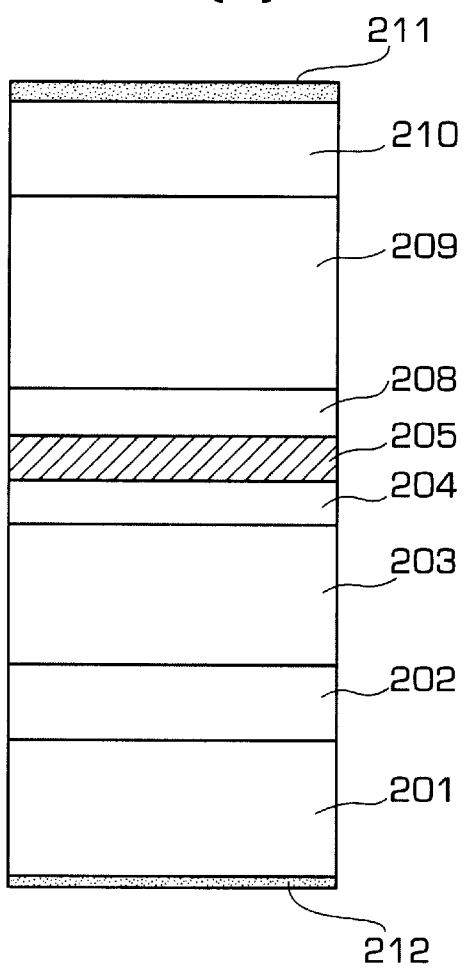
FIGS. 2(A)–(C) are block diagrams of another II–VI compound semiconductor based light emitting device according to a third embodiment of present invention.

FIG. 2(a) is a cross-sectional view illustrating the structure of a semiconductor laser according to another embodiment of the present invention. On an n-type InP substrate 201, an n-type buffer layer 202 formed of silicon-doped InGaAs (silicon concentration: $1 \times 10^{18}$, thickness: 300 nm) and chlorine-doped ZnCdSe (chlorine concentration: $5 \times 10^{17}$, thickness: 30 nm), an n-typed cladding layer 203 formed of chlorine-doped $Mg_{0.4}(Zn_{0.47}Cd_{0.53})_{0.6}Se$ (chlorine concentration: $5 \times 10^{17}$, thickness: 1.5 μm) and an n-type guiding layer 204 formed of chlorine-doped $Mg_{0.2}(Zn_{0.47}Cd_{0.53})_{0.6}Se$ (chlorine concentration: $5 \times 10^{17}$, thickness: 120 nm) were grown in the above-described sequence by the MBE method.

Figure 2B:
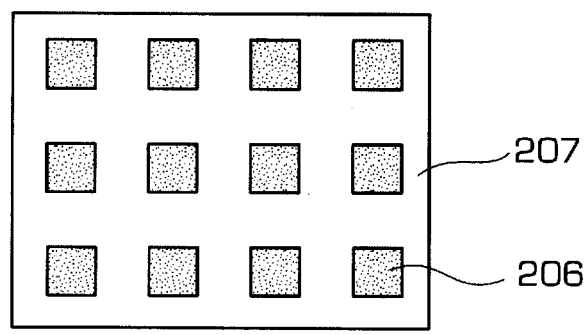

An iron-made rectangular mask (a 100 nm square) was inserted between a molecular beam source and the resulting substrate, whereby $Zn_{0.47}Cd_{0.53}Se$ light emitting regions 206 (thickness: 6.5 nm) having a type I hetero junction as shown in FIGS. 2(b) and (c) were formed. The iron-made rectangular mask was then removed and a ZnSe/ZnTe superlattice barrier region 207 having a type II hetero junction was formed so as to be embedded in the surroundings of the light emitting regions, whereby an active layer 205 was formed.

On the substrate so obtained, a p-type guiding layer 208 formed of nitrogen-doped $Mg_{0.2}(Zn_{0.47}Cd_{0.53})_{0.6}Se$ (chlorine concentration: $4 \times 10^{17}$, thickness: 120 nm), a p-type cladding layer 209 formed of nitrogen-doped $Mg_{0.4}(Zn_{0.47}Cd_{0.53})_{0.6}Se$ (nitrogen concentration: $1 \times 10^{17}$, thickness: 1 μm) and a p-type contact layer 210 formed of nitrogen-doped ZnSeTe (nitrogen concentration: $1 \times 10^{18}$, thickness: 0.05 µm) were epitaxially grown.

On the wafer so obtained, an Au electrode 211 (thickness: 200 nm) was formed by vacuum deposition method, while an In electrode 212 was formed on the side of the substrate.

Figure 2C:
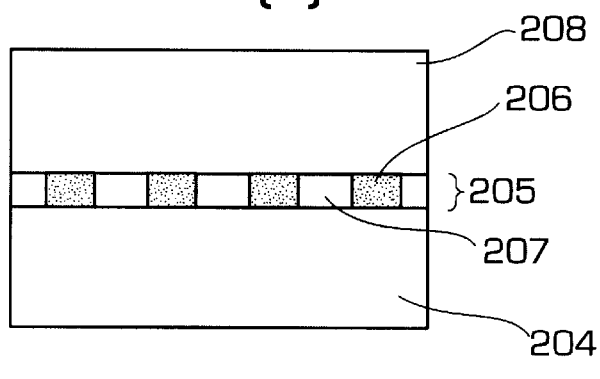

When a direct current was applied to the semiconductor laser of FIG. 2 fabricated in the above-described manner, the laser oscillated at a wavelength of 595 nm and its lifetime was as long as about 2000 hours. From the laser whose oscillation stopped, destruction of the electrode portion was observed, which clearly indicated that the termination of the oscillation did not result from the degradation caused by the propagation of defects. As a result of the observation inside the active layer, defects appeared in some of many ZnCdSe light emitting regions 206 but the propagation of the defects in the regions was suppressed. It has therefore been confirmed that the constitution in which the light emitting regions were formed independently of each other by embedding a type II hetero junction material in the surroundings of the light emitting regions is effective for suppressing the propagation of the defects.

In this embodiment, ZnCdSe was used as the active layer material. It is also possible to use the other II–VI compound semiconductor materials such as ZnSeTe mixed crystals. As the cladding material, MgZnCdSe was employed but it is also possible to use the other II–VI compound semiconductor materials such as ZnMgSeTe. As a substrate, an n-type InP was used. Substrates formed of other materials such as p-type InP substrate can also be used. Furthermore, in this embodiment, a material having type I hetero junction was used for a light emitting region, while a material having type II hetero junction was used for a barrier region (non light emitting region). Alternatively, it is possible to grow each layer in a similar manner to this embodiment except that a direct transition semiconductor material such as ZnCdSe and indirect transition semiconductor material such as GaP or AlInP may be employed for the light emitting region and barrier region, respectively.

EXAMPLE 3

Figure 3A:
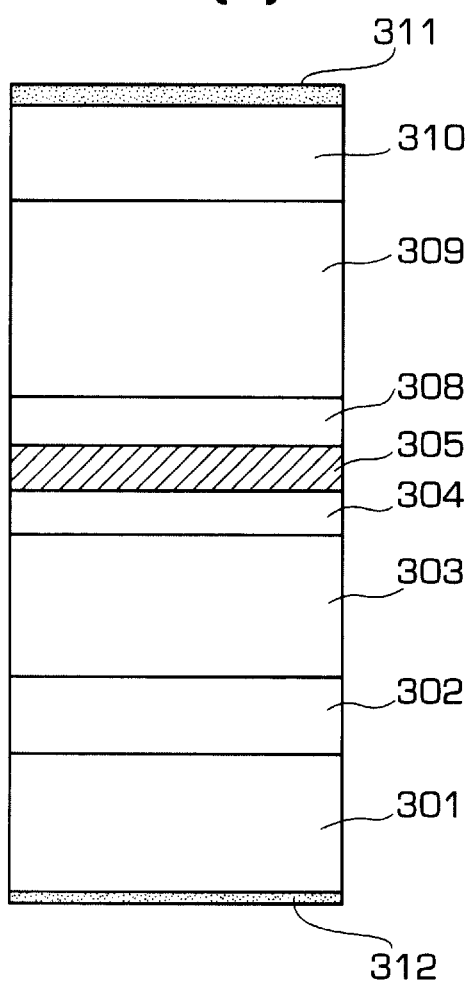
FIGS. 3(A)–(C) are block diagrams of a further II–VI compound semiconductor based light emitting device according to the present invention.

FIG. 3(a) is a cross-sectional view illustrating the structure of a semiconductor laser according to a further embodiment of the present invention. On a (311) plane of an n-type GaAs substrate 301 which has an inclination of about 25° relative to (100) JUST substrate, an n-type buffer layer 302 formed of silicon-doped GaAs (silicon concentration: $1 \times 10^{18}$, thickness: 300 nm) and chlorine-doped ZnSe (chlorine concentration: $5 \times 10^{17}$, thickness: 30 nm), an n-typed cladding layer 303 formed of chlorine-doped $Zn_{0.092}Mg_{0.08}S_{0.12}Se_{0.88}$ (chlorine concentration: $5 \times 10^{17}$, thickness: 1.5 µm), an n-type guiding layer 304 formed of chlorine-doped $ZnS_{0.06}Se_{0.94}$ (chlorine concentration: $5 \times 10^{17}$, thickness: 120 nm) and an active layer 305 (thickness: 6.5 nm) formed of ZnCdSe were grown in the above-described sequence by the MBE method.

Figure 3B:
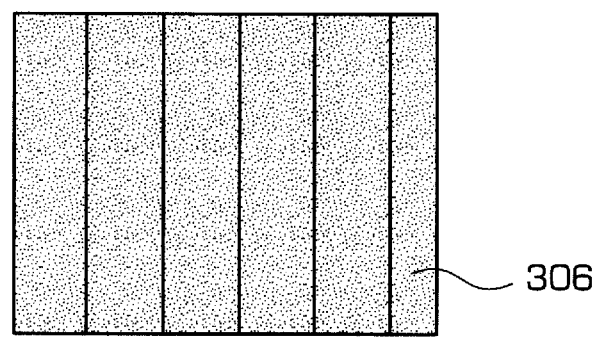
Figure 3C:
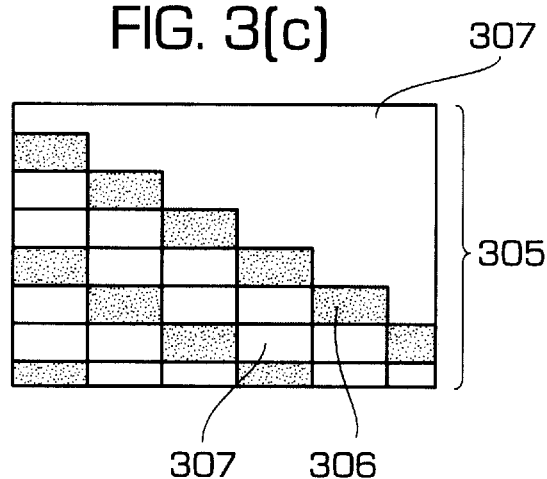

At that time, the substrate had a slanted surface so that microscopically it had steps as illustrated in FIGS. 3(b) and (c). $Zn_{0.67}Cd_{0.33}Se$ light emitting regions 306 and $ZnS_{0.06}Se_{0.94}$ barrier regions 307 were grown alternately as illustrated in FIG. 3(c) by controlling the growing time in accordance with the step width in thickness direction of the layer. Then, the surface was embedded with the $ZnS_{0.06}Se_{0.94}$ barrier region 307. Incidentally, FIG. 3(b) is a plane view illustrating the active layer before the surface is embedded with the barrier region 307 and FIG. 3(c) is a cross-sectional view of the active layer 305.

On the substrate so obtained, a p-type guiding layer 308 formed of nitrogen-doped $ZnS_{0.06}Se_{0.94}$ (chlorine concentration: $4 \times 10^{17}$, thickness: 120 nm), a p-type cladding layer 309 formed of nitrogen-doped $Zn_{0.92}Mg_{0.08}S_{0.12}Se_{0.08}$ (nitrogen concentration: $1 \times 10^{17}$, thickness: 1 µm) and a p-type contact layer 310 formed of nitrogen-doped ZnSeTe (nitrogen concentration: $1 \times 10^{18}$, thickness: 0.05 µm) were epitaxially grown.

On the wafer so obtained, an Au electrode 311 (thickness: 200 nm) was formed by vacuum deposition method, while an In electrode 312 was formed on the side of the substrate.

When a direct current was applied to the semiconductor laser of FIG. 3 fabricated in the above-described manner, the laser oscillated at a wavelength of 502 nm and its lifetime was as long as about 1000 hours. From the laser whose oscillation stopped, destruction of the electrode portion was observed, which clearly indicated that the termination of the oscillation did not result from the degradation caused by the propagation of defects. As a result of the observation inside the active layer, defects appeared in some of many ZnCdSe light emitting regions 306 but the propagation of the defects in the region was suppressed. It has therefore been confirmed that the constitution of the light emitting regions each formed independently is effective for suppressing the propagation of the defects.

In this embodiment, ZnCdSe was used as the active layer material. It is also possible to use the other II–VI compound semiconductor materials such as ZnSe and ZnCdSSe and those containing Te, Be or Mg having a band gap and reflectance similar to that of ZnCdSe. As the barrier material, ZnSSe was employed but ZnMgSSe or the like having both a larger band gap and a lower reflectance may also be employed. As the cladding material, ZnMgSSe was employed but it is also possible to use the other II–VI compound semiconductor materials such as ZnMgCdSe and BeMgSeTe. As the substrate, an n-type GaAs was used. Substrates formed of the other materials such as p-type GaAs substrate and ZnSe substrate can also be used. In this embodiment, the slanted substrate (311) plane was used, but an orientation such as (111) plane or (511) plane may be employed alternatively.

EXAMPLE 4

Figure 4A:
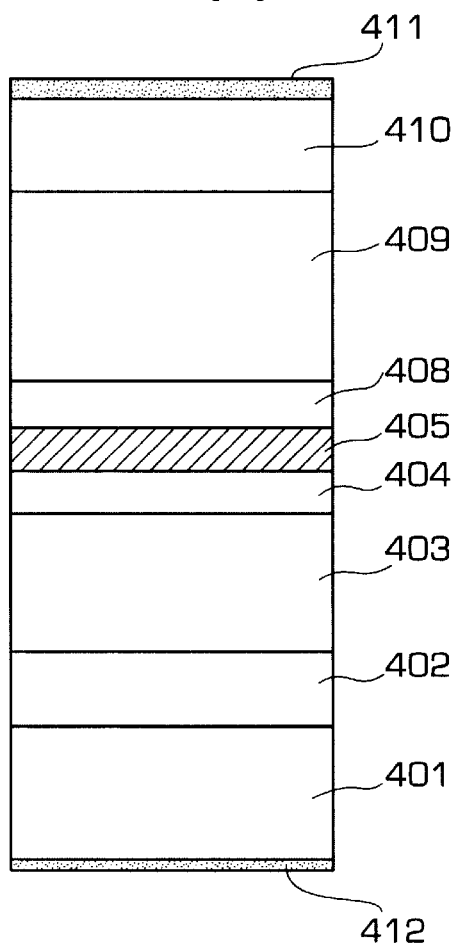
FIGS. 4(A)–(C) are block diagrams of a still further II–VI compound semiconductor based light emitting device according to a fourth embodiment of the present invention.

FIG. 4(a) is a cross-sectional view illustrating the structure of a semiconductor laser according to a still further embodiment of the present invention. On an n-type GaAs substrate 401, an n-type buffer layer 402 formed of silicon-doped GaAs (silicon concentration: $1 \times 10^{18}$, thickness: 300 nm) and chlorine-doped ZnSe (chlorine concentration: $5 \times 10^{17}$, thickness: 30 nm), an n-type cladding layer 403 formed of chlorine-doped $Zn_{0.92}Mg_{0.08}S_{0.12}Se_{0.88}$ (chlorine concentration: $5 \times 10^{17}$, thickness: 1.5 µm) and an n-type guiding layer 404 formed of chlorine-doped $ZnS_{0.06}Se_{0.94}$ (chlorine concentration: $5 \times 10^{17}$, thickness: 120 nm) were grown in the above-described order by the MBE method.

Figure 4B:
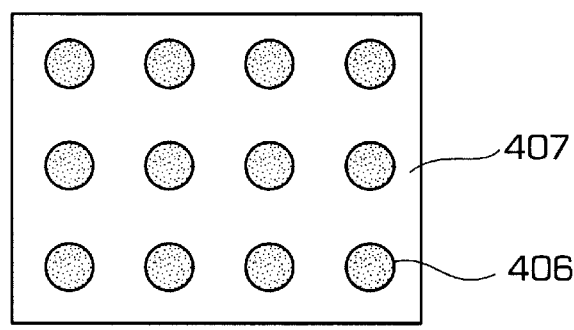

An active layer 405 was fabricated as follows. On the substrate so fabricated, $Zn_{0.7}Cd_{0.3}Se$ having a distortion amount of 2% was grown and was kept on growing, whereby ZnCdSe light emitting regions 406, each having a diameter of about 50 nm and a height of 20 nm, were formed independently of each other as illustrated in FIGS. 4(b) and (c) $ZnS_{0.06}Se_{0.94}$ was embedded between the light emitting regions 406 to form a barrier region 407. Here, the distortion amount is required to be at least 1.5%, but is preferred to be not greater than 8%.

On the substrate so obtained, a p-type guiding layer 408 formed of nitrogen-doped $ZnS_{0.06}Se_{0.94}$ (chlorine concentration: $4 \times 10^{17}$, thickness: 120 nm), a p-type cladding layer 409 formed of nitrogen-doped $Zn_{0.92}Mg_{0.08}SO_{0.12}Se_{0.88}$ (nitrogen concentration $1 \times 10^{17}$, thickness: 1 µm) and a p-type contact layer 410 formed of nitrogen-doped ZnSeTe (nitrogen concentration: $1 \times 10^{18}$, thickness: 0.05 µm) were epitaxially grown.

On the wafer so obtained, an Au electrode 411 (thickness: 200 nm) was formed by vacuum deposition method, while an In electrode 412 was formed on the side of the substrate.

Figure 4C:
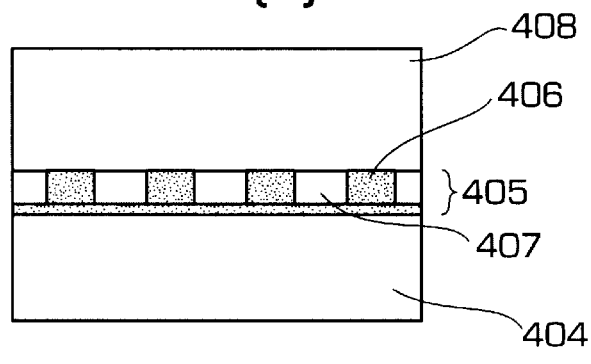

When a direct current was applied to the semiconductor laser of FIG. 4 fabricated in the above-described manner, the laser oscillated at a wavelength of 515 nm and its lifetime was as long as about 2000 hours. From the laser whose oscillation stopped, destruction of the electrode portion was observed, which clearly indicated that the termination of the oscillation did not result from the degradation caused by the propagation of defects. As a result of the observation inside the active layer, defects appeared in some of many ZnCdSe light emitting regions 406 but the propagation of the defects in these regions was suppressed. It has therefore been confirmed that the constitution of the light emitting regions formed independently of each other is effective for suppressing the propagation of the defects.

In this embodiment, ZnCdSe was used as the active layer material, but it is possible to use the other II–VI compound semiconductor materials such as ZnSe and ZnCdSSe and those containing Te, Be or Mg having a band gap and reflectance similar to those of ZnCdSe. As the barrier material, ZnSSe was used but ZnMgSSe or the like having both a larger band gap and a lower reflectance can also be used. As the cladding layer material, ZnMgSSe was employed but it is also possible to use the other II–VI compound semiconductor materials such as ZnMgCdSe and BeMgSeTe. As the substrate, an n-type GaAs was used. Alternatively, a substrate formed of another material, for example, a p-type GaAs substrate or a ZnSe substrate can be used.

EXAMPLE 5

Figure 5A:
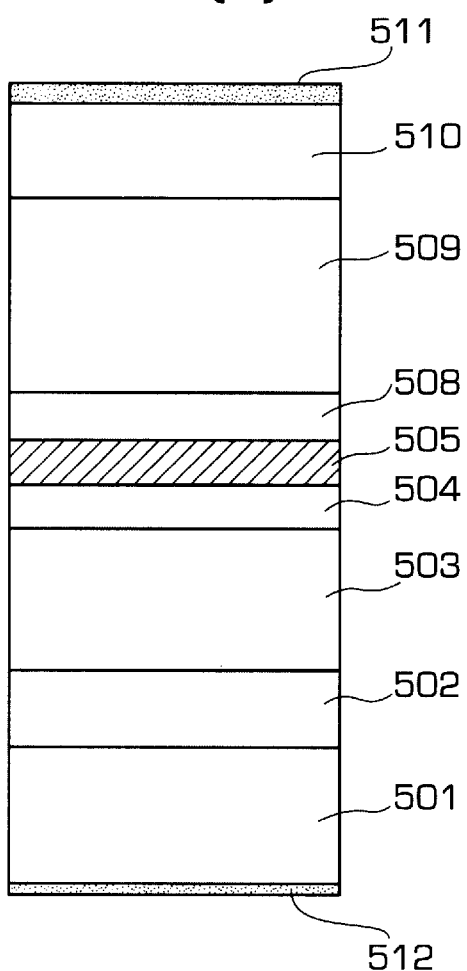
FIGS. 5(A)–(C) are block diagrams of a still further II–VI compound semiconductor based light emitting device according to a fifth embodiment of the present invention.

FIG. 5(a) is a cross-sectional view illustrating the structure of a semiconductor laser according to a still further embodiment of the present invention. On an n-type GaAs substrate 501, an n-type buffer layer 502 formed of silicon-doped GaAs (silicon concentration: $1 \times 10^{18}$, thickness: 300 nm) and chlorine-doped ZnSe (chlorine concentration: $5 \times 10^{17}$, thickness: 30 nm), an n-typed cladding layer 503 formed of chlorine-doped $Zn_{0.92}Mg_{0.08}S_{0.12}Se_{0.88}$ (chlorine concentration: $5 \times 10^{17}$, thickness: 1.5 $\mu$m) and an n-type guiding layer formed of chlorine-doped $ZnS_{0.06}Se_{0.94}$ (chlorine concentration: $5 \times 10^{17}$, thickness: 120 nm) were grown in the above-described order by the MBE method.

Figure 5B:
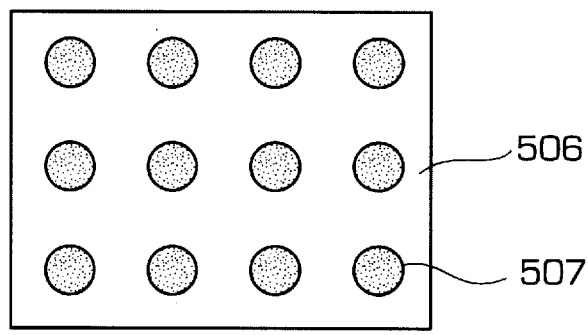

An active layer 505 was fabricated as described below. On the substrate so fabricated, $ZnS_{0.5}Se_{0.5}$ having a distortion amount of 2% was grown and was kept on growing, whereby ZnSSe barrier regions 507, each having a diameter of about 40 nm and a height of 15 nm, were formed independently each other as illustrated in FIGS. 5(b) and (c). $Zn_{0.3}Cd_{0.7}Se$ was then embedded between the barrier regions 507 to form a light emitting region 506. Here, it is preferred that the barrier material is selected to have a distortion amount great enough to form the above-described convex region and have a band gap greater than the light emitting region. The distortion amount is required to be at least 1.5%, but is preferred to be not greater than 8%.

On the substrate so obtained, a p-type guiding layer 508 formed of nitrogen-doped $ZnS_{0.06}Se_{0.94}$ (chlorine concentration: $4 \times 10^{17}$, thickness: 120 nm), a p-type cladding layer 509 formed of nitrogen-doped $Zn_{0.92}Mg_{0.08}S_{0.12}Se_{0.88}$ (nitrogen concentration: $1 \times 10^{17}$, thickness: 1 $\mu$m) and a p-type contact layer 510 formed of nitrogen-doped ZnSeTe (nitrogen concentration: $1 \times 10^{18}$, thickness: 0.05 $\mu$m) were epitaxially grown.

On the wafer so obtained, an Au electrode 511 (thickness: 200 nm) was formed by vacuum deposition method, while an In electrode 512 was formed on the side of the substrate.

Figure 5C:
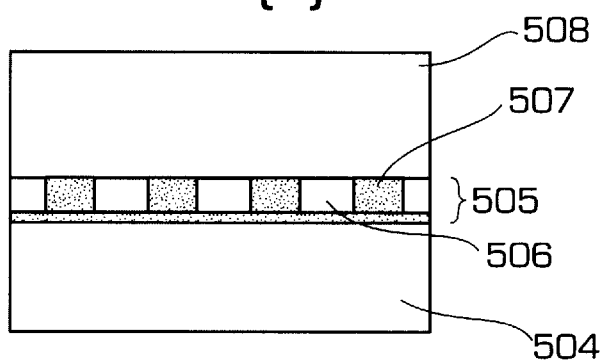

When a direct current was applied to the semiconductor laser of FIG. 5 fabricated in the above-described manner, the laser oscillated at a wavelength of 520 nm and its lifetime was as long as about 2000 hours. From the laser whose oscillation stopped, destruction of the electrode portion was observed, which clearly indicated that the termination of the oscillation did not result from the degradation caused by the propagation of defects. As a result of the observation inside the active layer, defects appeared in some portions of ZnCdSe light emitting regions 506 but the propagation of the defects in the region was suppressed. It has therefore been confirmed that the constitution of the light emitting regions formed almost independently of each other is effective for suppressing the propagation of the defects.

In this Example, complete spatial separation of light emitting regions cannot be actualized, but since the propagation of defects generally has a certain direction, the propagation can be stopped when the defects collide with the barrier region in the convex form.

In this embodiment, ZnCdSe was used as the active layer material, but it is possible to use the other II–VI compound semiconductor materials such as ZnSe and ZnCdSSe and those containing Te, Be or Mg having a band gap and a reflectance similar to those of ZnCdSe. As the barrier material, ZnSSe was used but ZnMgSSe or the like having both a larger band gap and a lower reflectance can also be used. As the cladding layer material, ZnMgSSe was employed but it is also possible to use the other II–VI compound semiconductor materials such as ZnMgCdSe and BeMgSeTe. As the substrate, an n-type GaAs was used. Alternatively, a substrated formed of another material such as p-type GaAs substrate or ZnSe substrate can be used.

What is claimed is:

1. A II–VI compound semiconductor based light emitting device comprising an active layer including a first material forming a recombination region and a second material forming a non-recombination region of carriers in a planar direction of the active layer, and a substrate having a slanted surface wherein the active layer is separated spatially into a recombination region and non-recombination region of carriers corresponding to a step distance between the active layer and the slant of the substrate surface in the thickness direction of the active layer and effecting step flow growth of the active layer in the plane of the active layer.

2. The II–VI compound semiconductor based light emitting device of claim 1, wherein the active layer comprises a plurality of layers, wherein each of said plurality of layers includes the recombination and non-recombination regions.

3. The II–VI compound semiconductor based light emitting diode of claim 2, wherein the slanted surface of said substrate slants from a first end of said substrate downward towards a second end of said substrate, such that the first end of said substrate is higher than the second end of the substrate.

4. A II–VI compound semiconductor based light emitting device comprising an active layer including a first material forming a recombination region and a second material forming a non-recombination region of carriers in a planar direction of the active layer, wherein the recombination region has a type I hetero junction and the non-recombination region has a type II hetero junction.

5. A II–VI compound semiconductor based light emitting device comprising an active layer including a first material forming a recombination region and a second material forming a non-recombination region of carriers in a planar direction of the active layer, wherein the recombination region is formed from a direction transition semiconductor material and the non-recombination region is formed from an indirect transition semiconductor material.

6. A II–VI compound semiconductor based light emitting device comprising an active layer including a first material forming a recombination region and a second material forming a non-recombination region of carriers in a planar direction of the active layer, wherein the active layer comprises an active layer material having a distortion amount of at least 1.5% to cause self-formation of recombination regions, the self-formed recombination regions being independent of each other, and said non-recombination region comprises a barrier material disposed between said self-formed recombination regions.

7. The II–VI compound semiconductor based light emitting device of claim 6, wherein the active layer material comprises Zn, Cd and Se and the barrier material comprises Zn, S and Se.

8. A II–VI compound semiconductor based light emitting device comprising an active layer including a first material forming a recombination region and a second material forming a non-recombination region of carriers in a planar direction of the active layer, wherein the active layer comprises a barrier material having a distortion amount of at least 1.5% to cause self formation of non-recombination regions, the self-formed non-recombination regions being independent of each other, and said recombination region comprises an active layer material between the self-formed non-recombination regions.

9. A II–VI compound semiconductor based light emitting device comprising an active layer having a major planar surface, said major planar surface being separated spatially into at least a first material forming a recombination region and a second material forming a non-recombination region of carriers, and a substrate having a stepped surface wherein the active layer is separated spatially into a recombination region and non-recombination region of carriers corresponding to a step distance between the active layer and a step level of the substrate surface in the thickness direction of the active layer and effecting the step-wise growth of the active layer in the plane of the active layer.

10. The II–VI compound semiconductor based light emitting device of claim 9, wherein the active layer comprises a plurality of layers, wherein each of said plurality of layer includes the recombination and non-recombination regions.

11. The II–VI compound semiconductor based light emitting device of claim 10, wherein the active layer comprises a plurality of layers, wherein each of said plurality of layers includes the first material forming the recombination region and the second material forming the non-recombination region, wherein the first material comprises Zn, Cd, Se and the second material comprises Zn, S and Se.

12. The II–VI compound semiconductor based light emitting diode of claim 10, wherein the stepped surface of said substrate steps from a first end of said substrate downward towards a second end of said substrate, such that the first end of said substrate is higher than the second end of the substrate.

13. A II–VI compound semiconductor based light emitting device comprising an active layer having a major planar surface, said major planar surface being separated spatially into at least a first material forming a recombination region and a second material forming a non-recombination region of carriers, wherein the recombination region has a type I hetero junction and the non-recombination region has a type II hetero junction.

14. A II–VI compound semiconductor based light emitting device comprising an active layer having a major planar surface, said major planar surface being separated spatially into at least a first material forming a recombination region and a second material forming a non-recombination region of carriers, wherein the recombination region is formed from a direct transition semiconductor material and the non-recombination region is formed from an indirect transition semiconductor material.

15. A II–VI compound semiconductor based light emitting device comprising an active layer having a major planar surface, said major planar surface being separated spatially into at least a first material forming a recombination region and a second material forming a non-recombination region of carriers, wherein the active layer comprises an active layer material having a distortion amount of at least 1.5% to cause self-formation of recombination regions, the self-formed recombination regions being independent of each other, and said non-recombination region comprises a barrier material disposed between said self-formed recombination regions.

16. The II–VI compound semiconductor based light emitting device of claim 15, wherein the active layer material comprises Zn, Cd and Se and the barrier material comprises Zn, S and Se.

17. A II–VI compound semiconductor based light emitting device comprising an active layer having a major planar surface, said major planar surface being separated spatially into at least a first material forming a recombination region and a second material forming a non-recombination region of carriers, wherein the active layer comprises a barrier material having a distortion amount of at least 1.5% to cause self formation of non-recombination regions, the self-formed non-recombination regions being independent of each other, and said recombination region comprises an active layer material between the self-formed non-recombination regions.

* * * * *